(12) United States Patent
Rapp et al.

(10) Patent No.: US 12,064,905 B2
(45) Date of Patent: Aug. 20, 2024

(54) FIXTURES AND RELATED SYSTEMS AND METHODS

(71) Applicant: ILLUMINA, INC., San Diego, CA (US)

(72) Inventors: Michael Rapp, San Diego, CA (US); Timothy Merkel, Escondido, CA (US); Audrey Zak, San Diego, CA (US)

(73) Assignee: ILLUMINA, INC., San Diego, CA (US)

( * ) Notice: Subject to any disclaimer, the term of this patent is extended or adjusted under 35 U.S.C. 154(b) by 49 days.

(21) Appl. No.: 17/460,615

(22) Filed: Aug. 30, 2021

(65) Prior Publication Data

US 2022/0063147 A1   Mar. 3, 2022

Related U.S. Application Data

(60) Provisional application No. 63/073,423, filed on Sep. 1, 2020.

(51) Int. Cl.
*B29C 39/44* (2006.01)
*B29C 33/20* (2006.01)
(Continued)

(52) U.S. Cl.
CPC ............ *B29C 39/44* (2013.01); *B29C 33/202* (2013.01); *B29C 39/02* (2013.01); *B29C 39/26* (2013.01);
(Continued)

(58) Field of Classification Search
CPC . B29C 2033/207; B29C 39/44; B29C 33/202; B29C 39/02; B29C 2791/006;
(Continued)

(56) References Cited

U.S. PATENT DOCUMENTS 10,569,520 B2 * 2/2020 Tsao ..................... H01L 21/681
2004/0251775 A1 12/2004 Choi et al.
(Continued)

FOREIGN PATENT DOCUMENTS

JP   2019-136942 A   8/2019
KR   2008-0097807 A   11/2008
(Continued)

OTHER PUBLICATIONS

English Translation of Jo (KR 10/20080097807) (Year: 2008).*
(Continued)

*Primary Examiner* — Michael A Tolin
*Assistant Examiner* — Hana C Page
(74) *Attorney, Agent, or Firm* — MARSHALL, GERSTEIN & BORUN LLP

(57) ABSTRACT

Fixtures and related system and methods are disclosed. In accordance with an implementation, a method includes applying a resin onto a substrate and positioning the substrate on over a chuck of a base of a fixture. The method also includes moving a mold into engagement with the resin and curing the resin. The method also includes detaching the mold and the resin and, while detaching the mold and the resin, determining a detachment force applied as a function of a distance of detachment between the mold and the resin.

12 Claims, 11 Drawing Sheets

(51) Int. Cl.
   *B29C 39/02* (2006.01)
   *B29C 39/26* (2006.01)
(52) U.S. Cl.
   CPC .. *B29C 2033/207* (2013.01); *B29C 2791/006* (2013.01)
(58) Field of Classification Search
   CPC ......... B29C 33/20; B29C 43/18; B29C 43/26; B29C 2059/023; G03F 7/0002; G03F 7/70808; G03F 7/0015
   See application file for complete search history.

(56) References Cited

U.S. PATENT DOCUMENTS

| | | | | |
|---|---|---|---|---|
| 2018/0117805 A1* | 5/2018 | Choi | ..................... | G03F 7/0002 |
| 2020/0353650 A1* | 11/2020 | Vogler | .................. | G03F 7/0015 |

FOREIGN PATENT DOCUMENTS

| | | | | |
|---|---|---|---|---|
| WO | WO-2014/145826 A2 | 9/2014 | | |
| WO | WO-2016081337 A1 * | 5/2016 | ........... | B32B 43/006 |

OTHER PUBLICATIONS

Dunn, "Design and Mechanical Evaluation of a Novel Fiber-Reinforced Scaffold for Meniscus Replacement," J Biomed Mater Res A. Jan. 2012; 100(1): 195-202. doi:10.1002/jbm.a.33260. (Year: 2012).*

Tecni ("4 mm-6 mm Cable Catenary System From TECNI Cable," Available online 2015, <https://www.youtube.com/watch?v=zCgUnNC860E>). (Year: 2015).*

* cited by examiner

FIXTURES AND RELATED SYSTEMS AND METHODS

RELATED APPLICATION

This application claims the benefit of and priority to U.S. Provisional Patent Application No. 63/073,423, filed Sep. 1, 2020, the content of which is incorporated by reference herein in its entireties and for all purposes.

BACKGROUND

Patterned flow cells and/or microarrays can be produced using semiconductor manufacturing technologies. In some instances, parts produced using nanoimprint lithography have defects that may be identified during quality control procedures.

SUMMARY

Shortcomings of the prior art can be overcome and benefits as described later in this disclosure can be achieved through the provision of fixtures and related system and methods as described herein. Various implementations of the apparatus and methods are described below, and the apparatus and methods, including and excluding the additional implementations enumerated below, in any combination (provided these combinations are not inconsistent), may overcome these shortcomings and achieve the benefits described herein.

One parameter that has been found to affect defects in the parts produced using nanoimprint lithography is an amount of force used to detach the mold and the cured resin during a demolding procedure. To identify which resins, designs, and/or detachment rates require a lesser amount of detachment force during a demolding procedure, at least one aspect of this disclosure is directed toward benchtop test fixtures for use in nanoimprint lithography and related systems and methods. Advantageously, the test fixtures can be used to perform experiments to determine a detachment force applied on the mold when detaching the mold from the cured resin. Thus, an operator can test different demolding processes, different patterns, and/or different resins in a small scale or one-off production to determine which demolding process, which pattern, and/or which resin results in less defects and/or lower detachment forces. More generally, the disclosed test fixtures allow operators to make more informed decisions when creating custom detachment rate profiles, custom resins, and/or custom nanopattern arrays. Moreover, the disclosed test fixtures allow parameters to be quickly changed and tested allowing for those parameters associated with less product defectivity to be identified without the change-over time involved with production scale semi-conductor manufacturing equipment.

The detachment force can be shown as a function of a distance of detachment between the mold and the cured resin. Additionally, the test fixtures can be used to determine the detachment work and/or the total work of detachment represented by the area under a force versus distance curve. Using the disclosed implementations, molds created having different nanopattern densities, dimensions, and/or periodicity can be tested with different resin compositions and/or demolding procedures to identify which mold(s), resin composition(s), and/or molding procedure(s) has a lower detachment force.

In some implementations, the test fixtures include a base having a vacuum chuck on which a substrate is placed and a support hingably coupled to the base. The support has a mold support receptacle that receives a mold support that holds a mold. The mold may be referred to as a working stamp.

To produce a nanopatterned array using the disclosed implementations, resin is spin coated onto the substrate and the support is rotated toward the base to engage the mold and the resin. The resin is cured and a drive assembly attached to a load cell is used to detach the mold and the cured resin. As the drive assembly moves the load cell and the mold and the resin detach from one another, the load cell determines a force applied to the mold and a corresponding system determines a force applied to the mold as a function of a distance of detachment between the mold and the resin. In some implementations, the distance of detachment is a vertical distance that an edge of the support attached to the load cell travels. The detachment forces of different resins can be compared and the lower detachment force(s) identified, thereby allowing for resins, designs, and/or detachment rates and/or processes to be selected that produce working stamps and/or nanopatterned arrays having less defects.

In accordance with a first implementation, a method includes applying a resin onto a substrate and positioning the substrate over a chuck of a base of a fixture. The method also includes moving a mold into engagement with the resin and curing the resin. The method also includes detaching the mold and the resin and, while detaching the mold and the resin, determining a detachment force applied as a function of a distance of detachment between the mold and the resin.

In accordance with a second implementation, an apparatus includes a fixture including 1) a base having a chuck and 2) a support hingably coupled to the base and including a mold support receptacle. The support is couplable to a load cell.

In accordance with a third implementation, an apparatus includes a system having a load cell, a fixture, and a mold support. The fixture includes 1) a base including a chuck and 2) a support hingably coupled to the base and including a mold support receptacle and the mold support is received within the mold support receptacle. The support is couplable to the load cell.

In further accordance with the foregoing first, second, and/or third implementations, an apparatus and/or method may further include any one or more of the following:

In accordance with an implementation, the method includes securing the mold within a mold support and coupling the mold support to a support of the fixture.

In accordance with another implementation, the method includes hingably coupling the support and the base of the fixture.

In accordance with another implementation, the method includes changing a hinge point between the support and the base between a first position and a second position.

In accordance with another implementation, changing the hinge point includes spacing the hinge point from a plane defined by the mold or the mold support.

In accordance with another implementation, the method includes coupling the support and a load cell and detaching the mold and the resin includes detaching the mold and the resin while the support is coupled to the load cell.

In accordance with another implementation, coupling the support and the load cell includes clamping a strap at an end of the support and coupling the strap to the load cell.

In accordance with another implementation, clamping the strap includes closing a clamp at an end of the support.

In accordance with another implementation, the strap includes a zip tie.

In accordance with another implementation, engaging the mold and the resin includes rotating the mold support toward the base of the fixture.

In accordance with another implementation, the method includes drawing the substrate toward the chuck using a vacuum.

In accordance with another implementation, the support includes support brackets and the base includes base brackets hingably coupled with the support brackets.

In accordance with another implementation, each of the support brackets and the base brackets comprise an L-shaped bracket.

In accordance with another implementation, hinge points between the support brackets and the base brackets are spaced from a plane defined by the support.

In accordance with another implementation, the base brackets comprise a plurality of coupling apertures to allow a hinge point between the support and the base to change between a first position and a second position.

In accordance with another implementation, the support is rectangular and includes a corner support in each corner of the support.

In accordance with another implementation, the base includes a port fluidically coupled to the chuck.

In accordance with another implementation, an end of the support includes a clamp couplable to the load cell via a strap.

In accordance with another implementation, the apparatus includes an unpatterned foil coupled within the mold support, and a master template positioned on the chuck and a resin disposed on the master template.

In accordance with another implementation, the apparatus includes a mold coupled within the mold support, and a substrate positioned on the chuck and a resin disposed on the substrate.

In accordance with another implementation, the mold is movable into engagement with the resin and curable and the load cell is coupled to the support to determine a detachment force as the mold and the resin detach.

In accordance with another implementation, the load cell determines a force applied to the support and the system determines the force applied to the support as a function of a distance of detachment between the mold and the resin.

In accordance with another implementation, the apparatus includes set screws coupling the mold support within the mold support receptacle.

In accordance with another implementation, the chuck is a vacuum chuck.

It should be appreciated that all combinations of the foregoing concepts and additional concepts discussed in greater detail below (provided such concepts are not mutually inconsistent) are contemplated as being part of the inventive subject matter disclosed herein and may be implemented in any combination to achieve the benefits described herein. In particular, all combinations of claimed subject matter appearing at the end of this disclosure are contemplated as being part of the inventive subject matter disclosed herein and may be implemented in any combination to achieve the benefits described herein.

DETAILED DESCRIPTION

Although the following text discloses a detailed description of implementations of methods, apparatuses and/or articles of manufacture, it should be understood that the legal scope of the property right is defined by the words of the claims set forth at the end of this patent. Accordingly, the following detailed description is to be construed as examples only and does not describe every possible implementation, as describing every possible implementation would be impractical, if not impossible. Numerous alternative implementations could be implemented, using either current technology or technology developed after the filing date of this patent. It is envisioned that such alternative implementations would still fall within the scope of the claims.

Figure 1:
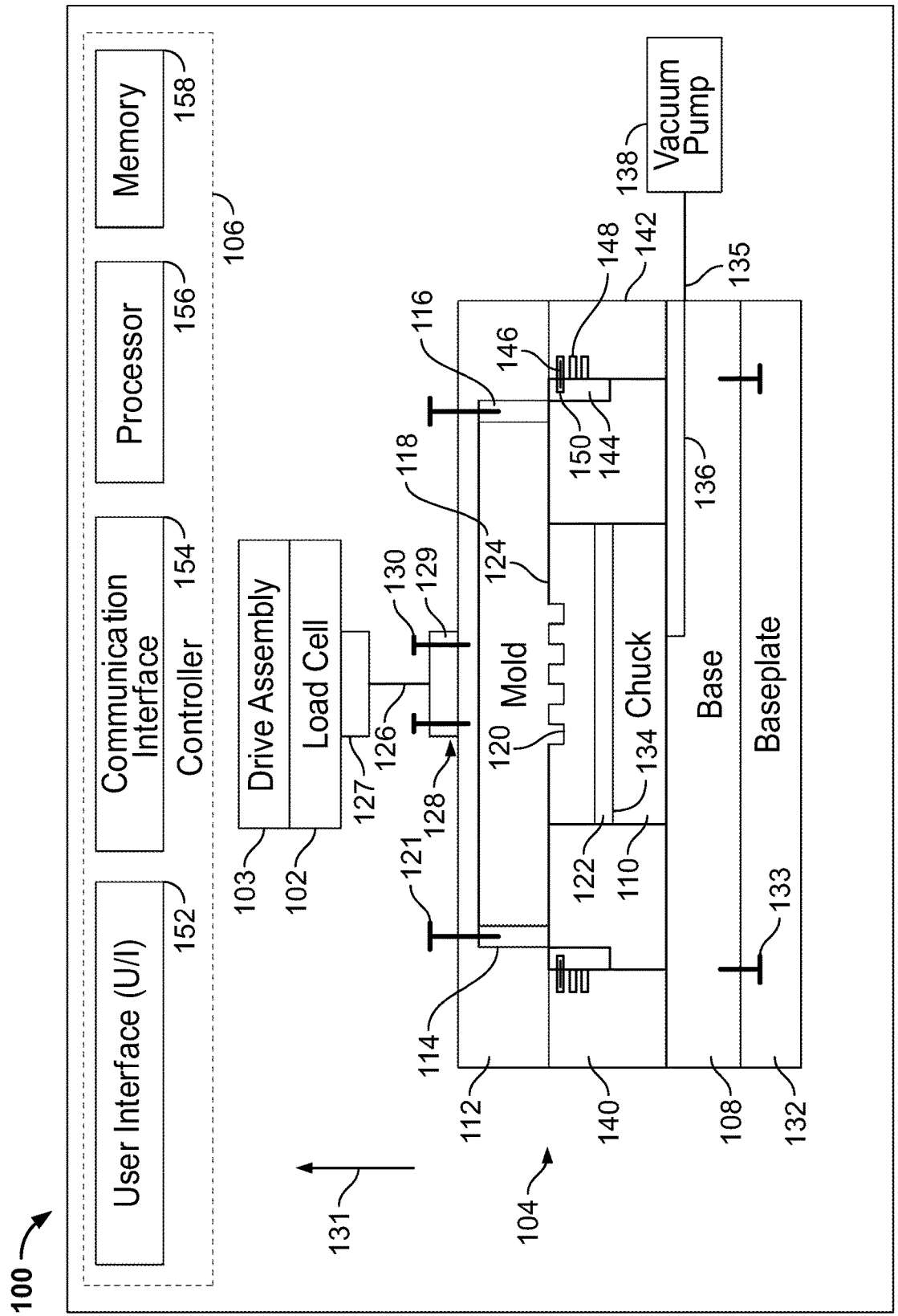
FIG. 1 is a schematic diagram of an implementation of a system in accordance with the teachings of this disclosure.

FIG. 1 is a schematic diagram of an implementation of a system 100 in accordance with the teachings of this disclosure. The system 100 can be used to perform tests on different resins when producing prototypes, patterned flow cells, microarrays, and/or associated working stamps using nanoimprint lithography and/or semiconductor manufacturing technologies. In the implementation shown, the system 100 may be a tabletop system for off-line imprinting processes and includes a load cell 102 and a drive assembly 103 that are used during a demolding procedure. The system 100 also includes a fixture 104 used to produce working stamps and/or nanopatterned arrays and a controller 106. The controller 106 is electrically and/or communicatively coupled to the load cell 102, the drive assembly 103, and/or the fixture 104 and is adapted to cause the load cell 102, the drive assembly 103, and/or the fixture 104 to perform various functions as disclosed herein.

In the implementation shown, the fixture 104 includes a base 108 having a chuck 110 and a support 112 coupled to the base 108 via a hinge and, thus, the chuck 110 and the support 112 are hingably coupled. The support 112 also includes a mold support receptacle 114. A mold support 116 can be received within the mold support receptacle 114 and holds a mold 118 having a pattern 120. The pattern 120 may include features having a dimension of between or equal to about 10 nanometers and about 3 microns and can be used to form wells in a flow cell. For example, some of the features on the pattern 120 may have a dimension of between or equal to about 200 nanometers and about 300 nanometers. More generally, a dimension of one or more features on the pattern 120 may be between or equal to about 10 nanometers and about 100 nanometers, between or equal to about 100 nanometers and about 1,000 nanometers, and/or between or equal to about 1,000 nanometers and about 10,000 nanometers. However, the features on the pattern 120 may be another size.

Figure 4:
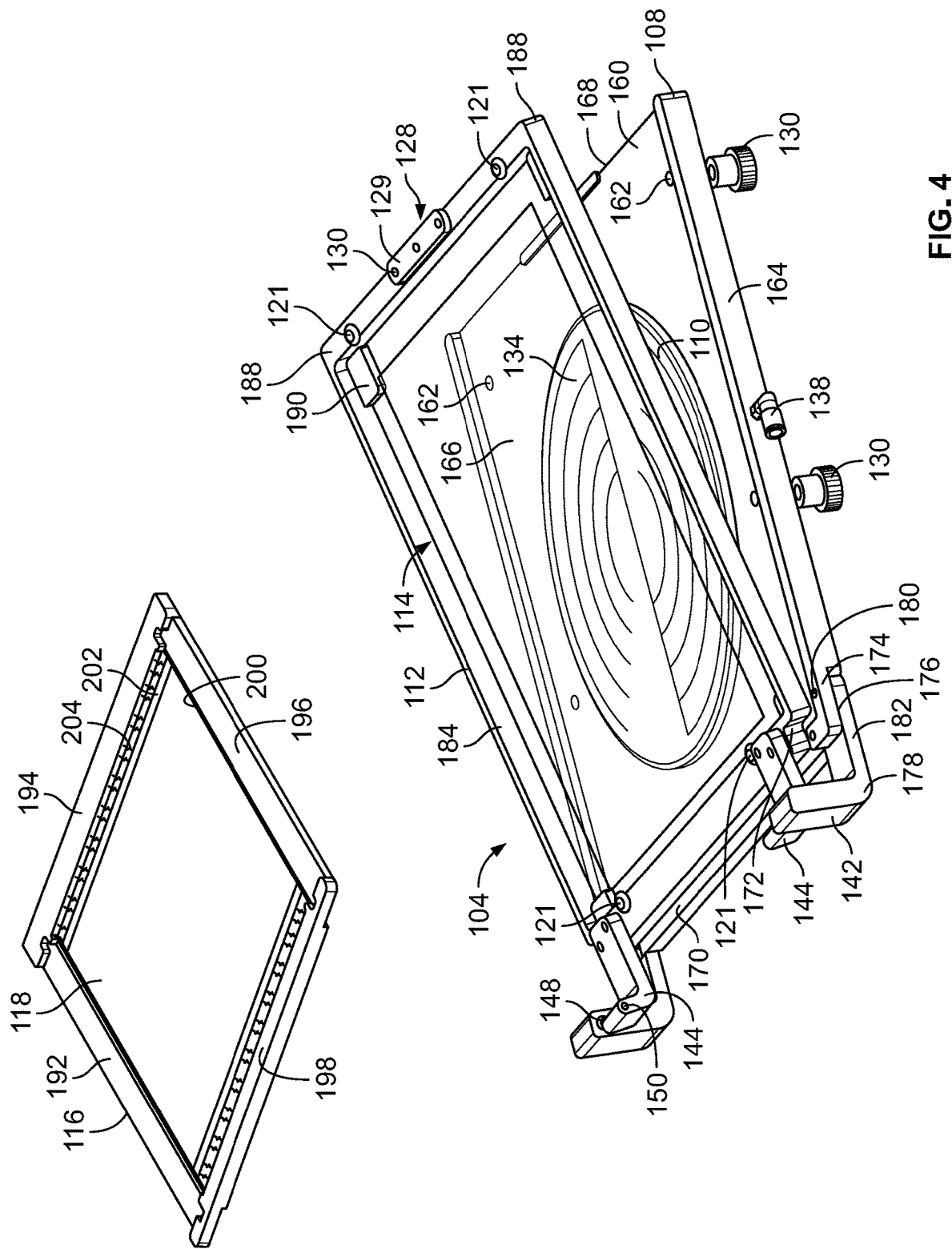
FIG. 4 is an isometric partially expanded view of an implementation of the fixture and of the mold support carrying the mold that can be used with the system of FIG. 1.

The mold support 116 is secured within the support 112 via fasteners 121 such as set screws and the mold 118 is secured to the mold support 116 via a mold clamp 202 (see, FIG. 4). The mold 118 may be referred to as a working stamp.

To produce a nanoimprint array, a substrate 122 is positioned over the chuck 110 and resin 124 is placed on the substrate 122. The substrate 122 may be directly on or indirectly on the chuck 110. Prior to engaging the mold 118 and the resin 124, the resin 124 may be heated to remove residual solvent from the resin 124. The resin 124 may be applied as a thin film having a thickness of less than or equal to about 1 µm. However, other materials and/or thicknesses may also be suitable. For example, the thickness of the resin 124 may be equal to or less than about 200 nanometers, between or equal to about 400 nanometers and about 500 nanometers, between or equal to about 1.5 µm and about 2.0 µm, and/or equal to or less than about 10 µm. More generally, the thickness of the resin 124 may be between or equal to about 200 nanometers and about 2,000 nanometers.

To imprint the pattern 120 from the mold 18 into the resin 124, the mold 118 is moved toward the resin 124 via the support 112 such that the mold 118 engages and is pressed into the resin 124 and the resin 124 is then cured. The mold 118 may be pressed into the resin 124 using a hand roller or another leveling device and a capillary force(s) between the resin 124 and the mold 118 may cause the mold 118 and the resin 124 to remain in contact. Alternatively, the drive assembly 103 can move the mold 118 into engagement with the resin 124. The system 100 can include an ultraviolet light source to cure the resin 124 in ultraviolet (UV) nanoimprint lithography and/or the system 100 can include a heating/cooling source to cure the resin 124 in thermal nanoimprint lithography. Alternatively, the fixture 104, the substrate 122, and the resin 124 can be removed from the system 100 to cure the resin 124 in an area outside of the system 100.

Regardless of how the resin 124 is cured, during a demolding procedure, the load cell 102 is coupled to the support 112 via a coupling 126. The coupling 126 may be a strap or a zip tie and can be secured to the load cell 102 using grippers 127 and can be secured to the support 112 using a clamp 128. The clamp 128 may be formed between a block 129 and the support 112 and is movable between a clamped position and an unclamped position via fasteners 130. To secure the coupling 126 and the support 112, the fasteners 130 are loosened, the coupling 126 is positioned between the block 129 and the support 112, and the fasteners 130 are tightened to secure the coupling 126 in the clamp 128.

Regardless of how the load cell 102 is attached to the support 112, after the load cell 102 is attached to the support 112, the drive assembly 103 moves the load cell 102 in a direction generally indicated by arrow 131 to detach the mold 118 and the cured resin 124. As the mold 118 is moved by the support 112 via its attachment with the load cell 102, the support 112 deters the mold 118 from rotating as the mold 118 is detached from the cured resin 124. The drive assembly 103 can move the load cell 102 at variable speeds and/or can pause the load cell 102 between movements. As a result, a detachment rate is selected for the resin 124 that achieves higher product quality (less defects) and, thus, less scrap. Some rates at which the drive assembly 103 can move the load cell 102 include about 10 millimeters (mm)/minute (min), about 50 mm/min, and/or about 100 mm/min. Other rates may also be suitable.

While moving the mold 118 away from the resin 124, the load cell 102 determines a force applied to the support 112 and the system 100 determines the force applied as a function of a distance of detachment between the mold 118 and the resin 124. In some implementations, the system 100 is a force and torque measurement system such as the Instron® 3342B Universal Testing System. However, other testing machines may be used. Additionally or alternatively, the system 100 can determine the detachment work and/or the total work of detachment represented by the area under a force versus distance curve. Different resin 124 compositions, resin 124 cure conditions, and/or mold 118 patterns 120 can change an amount of detachment force and/or an amount of detachment work. Some additional parameters that may affect the detachment force and/or the detachment work include a thickness of the mold 118, a type of the mold 118 used, a tension on the mold 118, a concentration of a leveling agent in the resin 124, a UV cure intensity, a UV cure time, a material used for the mold 118, mechanical properties of the mold 118, cure kinetics of the resin 124, and/or a quality of an anti-sticking layer used in association with the master template when producing the mold 118 and/or an anti-sticking layer applied to the mold 118. The anti-sticking layer can comprise any suitable material (e.g., polymeric material, monomers, monolayers), and can be applied to the master template to reduce adhesion between the master template and the resin 124 during, for example, a demolding procedure. By the system 100 monitoring parameters that affect the detachment forces and/or detachment work, those parameters and/or resins 124 that have a lower detachment force and/or are associated with less detachment work can be used to produce parts.

Still referring to the system 100 and the fixture 104, in the implementation shown, the system 100 includes a baseplate 132 and the base 108 of the fixture 104 is coupled to the baseplate 132 via fasteners 133. The baseplate 132 may be a breadboard and the fasteners 133 may be thumbscrews that allow the fixture 104 to be coupled to and decoupled from the system 100 relatively easily. For example, the fixture 104 may be coupled to the system 100 when the substrate 122 and the resin 124 are being applied to the chuck 110 and during the demolding procedure but the fixture 104 may be removed from the system 100 when the resin 124 is being cured. Additionally, the fasteners 133 allow the fixture 104 to be easily attached or removed from the system 100 so that one or more pre-measurement processes can be performed on the fixture 104.

The chuck 110 includes a surface 134 that receives the substrate 122 and is fluidically coupled to a port 135 of the base 108 via a fluidic line 136. The system 100 includes a vacuum pump 138 that is coupled to the port 135 and provides a suction force that holds the substrate 122 on the chuck 110. The vacuum pump 138 may be activated to secure the substrate 122 to the chuck 110 when the resin 124 is being applied to the substrate 122, when the mold 118 is engaging the resin 124, and/or when the mold 118 is being detached from the cured resin 124.

Referring to the base 108 and the support 112, in the implementation shown, the base 108 and the support 112 are hingably coupled together via a pair of hinges 140 that are formed by a pair of base brackets 142 of the base 108, a pair of support brackets 144 of the support 112, and pins 146 that are received within the brackets 142, 144 to couple the brackets 142, 144 together. In the implementation shown, the base brackets 142 define a plurality of coupling apertures 148 that are alignable with a corresponding coupling aperture 150 of the support bracket 144. The pin 146 can be inserted into different ones of the coupling apertures 148, 150 to allow a hinge point between the support 112 and the base 108 to change between, for example, a first position and a second position. The different hinge points can change an amount of leverage that the support 112 provides during a demolding procedure. While the base brackets 142 are shown including a plurality of coupling apertures 148, in other implementations, the support brackets 144 can additionally or alternatively include a plurality of coupling apertures 150.

Figure 10:
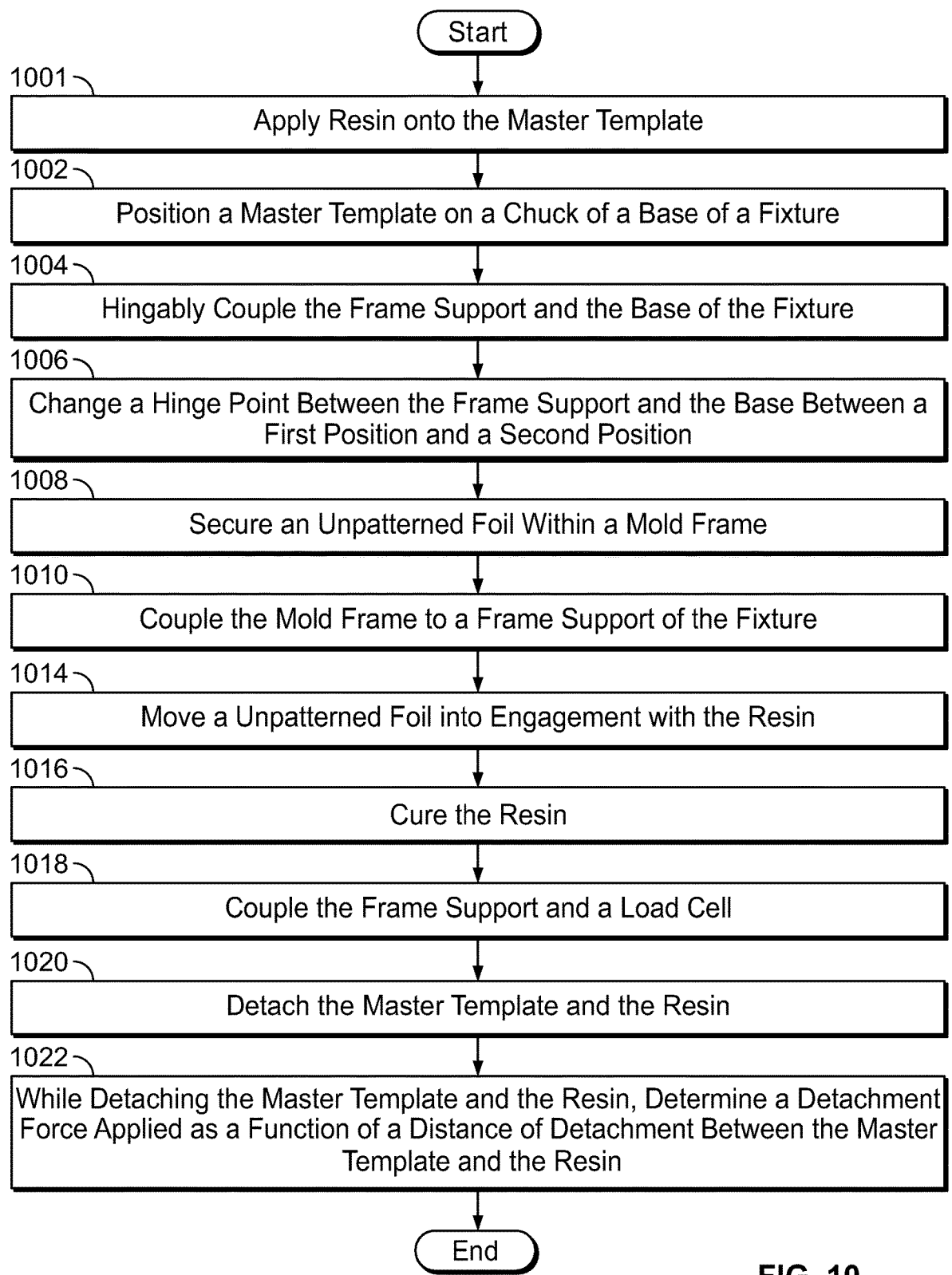
FIG. 10 illustrates another flowchart for an example method of determining detachment forces during a demolding procedure as disclosed herein.

While the above example mentions using the system 100 to produce and test nanopattern arrays, the system 100 may similarly be used to produce and test the molds 118 as discussed in further detail in FIG. 10. In such implementations and to produce the mold 118, a master template is placed on the chuck 110 and an unpatterned foil is coupled to the mold support 116. The anti-sticking layer may be applied to the master template to reduce adhesion between the master template and the resin 124, the resin 124 is applied to the master template, and the unpatterned foil is laminated onto the resin 124 to produce the mold 118 referred to as a working stamp. Applying the resin 124 to the master template allows the resin 124 to fill into a nanopattern array defined by the master template.

Referring to the controller 106, in the implementation shown, the controller 106 includes a user interface 152, a communication interface 154, one or more processors 156, and a memory 158 storing instructions executable by the one or more processors 156 to perform various functions including the disclosed implementations. The user interface 152, the communication interface 154, and the memory 158 are electrically and/or communicatively coupled to the one or more processors 156.

In an implementation, the user interface 152 is adapted to receive input from a user and to provide information to the user associated with the operation of the system 100 and/or an analysis taking place. The user interface 152 may include a touch screen, a display, a key board, a speaker(s), a mouse, a track ball, and/or a voice recognition system. The touch screen and/or the display may display a graphical user interface (GUI).

In an implementation, the communication interface 154 is adapted to enable communication between the system 100 and a remote system(s) (e.g., computers) via a network(s). The network(s) may include the Internet, an intranet, a local-area network (LAN), a wide-area network (WAN), a coaxial-cable network, a wireless network, a wired network, a satellite network, a digital subscriber line (DSL) network, a cellular network, a Bluetooth connection, a near field communication (NFC) connection, etc. Some of the communications provided to the remote system may be associated with analysis results, testing data, etc. generated or otherwise obtained by the system 100. Some of the communications provided to the system 100 may be associated with a testing operation, a semiconductor manufacturing technology, and/or a protocol(s) to be executed by the system 100.

The one or more processors 156 and/or the system 100 may include one or more of a processor-based system(s) or a microprocessor-based system(s). In some implementations, the one or more processors 156 and/or the system 100 includes one or more of a programmable processor, a programmable controller, a microprocessor, a microcontroller, a graphics processing unit (GPU), a digital signal processor (DSP), a reduced-instruction set computer (RISC), an application specific integrated circuit (ASIC), a field programmable gate array (FPGA), a field programmable logic device (FPLD), a logic circuit, and/or another logic-based device executing various functions including the ones described herein.

The memory 158 can include one or more of a semiconductor memory, a magnetically readable memory, an optical memory, a hard disk drive (HDD), an optical storage drive, a solid-state storage device, a solid-state drive (SSD), a flash memory, a read-only memory (ROM), erasable programmable read-only memory (EPROM), electrically erasable programmable read-only memory (EEPROM), a random-access memory (RAM), a non-volatile RAM (NVRAM) memory, a compact disc (CD), a compact disc read-only memory (CD-ROM), a digital versatile disk (DVD), a Blu-ray disk, a redundant array of independent disks (RAID) system, a cache and/or any other storage device or storage disk in which information is stored for any duration (e.g., permanently, temporarily, for extended periods of time, for buffering, for caching).

Figure 2:
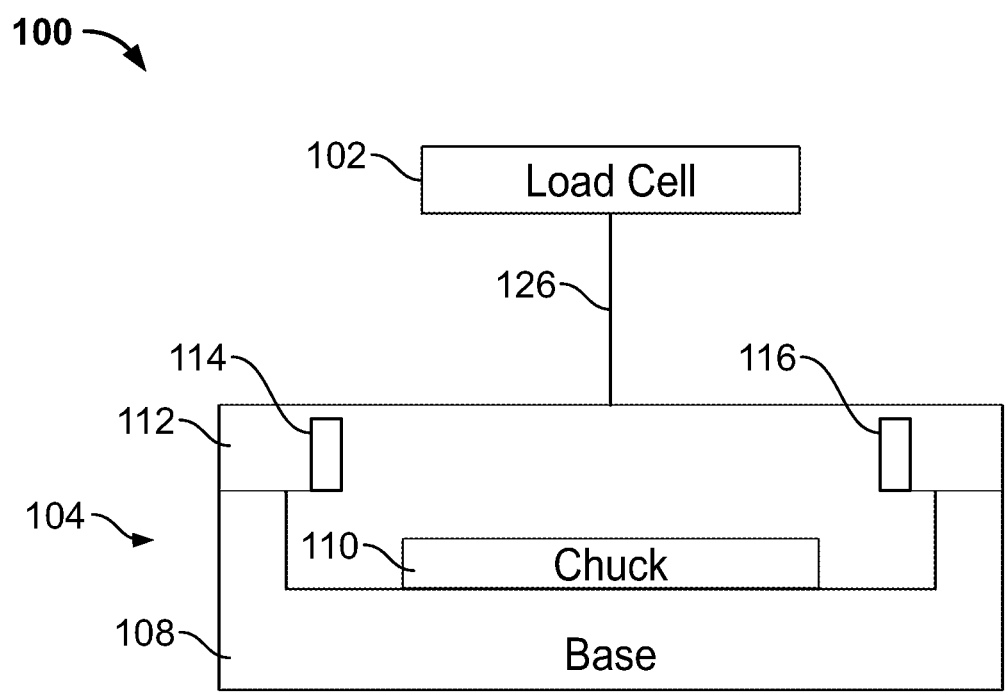
FIG. 2 is a schematic diagram of another implementation of the system of FIG. 1.

FIG. 2 is a schematic diagram of another implementation of the system 100 of FIG. 1. In the implementation shown, the system 100 includes the load cell 102, the fixture 104, and the mold support 116. As with the system 100 of FIG. 1, the fixture 104 of FIG. 2 includes the base 108 having the chuck 110 and the support 112 hingably coupled to the base 108 and including the mold support receptacle 114. The mold support 116 is shown disposed within the mold support receptacle 114 and the support 112 is shown coupled to the load cell 102, via the coupling 126, to allow the load cell 102 to determine a detachment force between the base 108 and the support 112.

Figure 3:
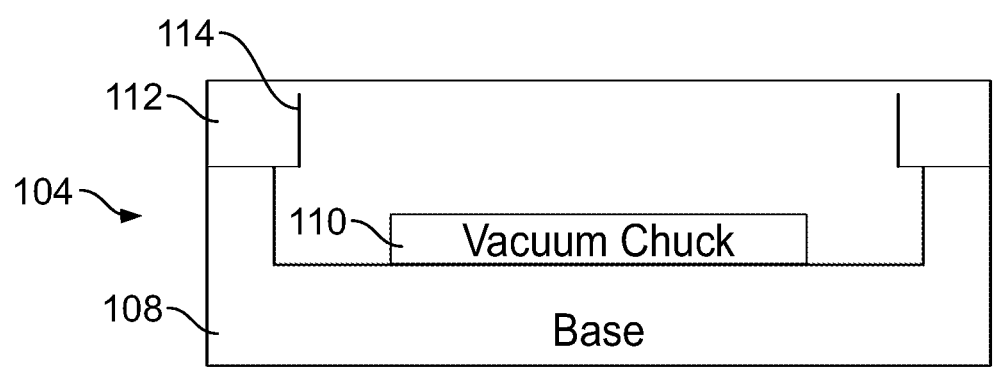
FIG. 3 is a schematic diagram of the fixture of FIG. 2.

FIG. 3 is a schematic diagram of the fixture 104 of FIG. 2 but without the mold support 116. In the implementation shown, the fixture 104 includes the base 108 having the chuck 110 and the support 112 hingably coupled to the base 108 and including the mold support receptacle 114. The support 112 is couplable to the load cell 102 to determine a detachment force between the base 108 and the support 112.

FIG. 4 is an isometric partially expanded view of an implementation of the fixture 104 and of the mold support 116 carrying the mold 118 that can be used with the system of FIG. 1. Referring to the base 108 of the fixture 104, in the implementation shown, the base 108 includes a central portion 160 that surrounds the chuck 110 and defines threaded bores 162 and L-shaped side walls 164. The fasteners 130 threadably engage the threaded bores 162 and the central portion 160 and the side walls 164 form a receptacle 166 having a front opening 168 and a rear opening 170. In the closed position (see, FIG. 5), the support 112 nests within the receptacle 166 of the base 108 and includes a pair or rear notches 172 that each receive a corresponding portion 174 of the side walls 164. While the side walls 164 are shown being L-shaped, in other implementations, the side walls 164 may be straight. Alternatively, the side walls 164 may be omitted.

In the implementation shown, the base 108 also defines lower notches 176 that each receives a leg 178 of the base brackets 142. The base brackets 142 are coupled to the base 108 using fasteners 180. However, the base brackets 142 and the base 108 can be coupled in different ways. Alternatively, the base brackets 142 and the base 108 can be integral.

The base brackets 142 and the support brackets 144 are shown in FIG. 4 as being upward facing L-shaped brackets 182 that allow a hinge point of the hinges 140 to be spaced from a plane formed by the support 112, the mold support 116, and/or the mold 118. As a result of the hinge points being out of plane, when the support 112, the mold support 116, and the mold 118 are moved upwardly and in a direction generally indicated by the arrow 131 as shown in FIG. 1, an end of the support 112 opposite the hinges 140 can be raised substantially vertically. As set forth herein, the phrase "substantially vertically" means less than or equal to about 15 degrees of vertical. A flexibility of the coupling 126 between the load cell 102 and the support 112 may additionally or alternatively allow the support 112 to be raised substantially vertically. The hinges 140 being out of plane relative to the mold 118 also allows the mold 118 to not prematurely contact the resin 124. Thus, the mold 118 can be positioned between about 0.1 mm and about 0.8 mm before engaging with the resin 124. The length of the brackets 142, 144 can also be changed to increase or decrease the leverage the support 112 provides during the demolding procedure.

Referring to the support 112, in the implementation shown, the support 112 is rectangular and has side walls 184 that intersect at corners 188 of the support 112. Corner supports 190 are coupled to the side walls 184 at each of the corners 188 and together with the side walls 184 form the mold support receptacle 114. When the mold support 116 is received within the mold support receptacle 114, the mold support 116 rests on the corner supports 190 and is secured within the mold support receptacle 114 via the fasteners 121.

Referring to the mold support 116, in the implementation shown, the mold support 116 is rectangular and has sides 192, 194, 196, 198 that form an opening 200. In the implementation shown, the mold clamps 202 are coupled to the opposing sides 194, 198 by springs 204. When using the mold support 116 to produce, for example, a nanopattern array, the mold 118 can be coupled to and between the mold clamps 202. The springs 204 are used to maintain tension on the mold 118.

While the mold support 116 is shown including two mold clamps 202, the mold support 116 may alternatively include one mold clamp 202 that is, for example, coupled to the distal side 194 of the mold support 116. Moreover, while the mold support 116 is shown including a number of the springs 204 in a particular arrangement, any number of springs may be used (e.g., 1, 2, 4) that are positioned in any arrangement. Additionally, while a single mold support is shown in FIG. 4, any number of mold supports may be used with the fixture 104 that may be similar or different from one another.

Figure 5:
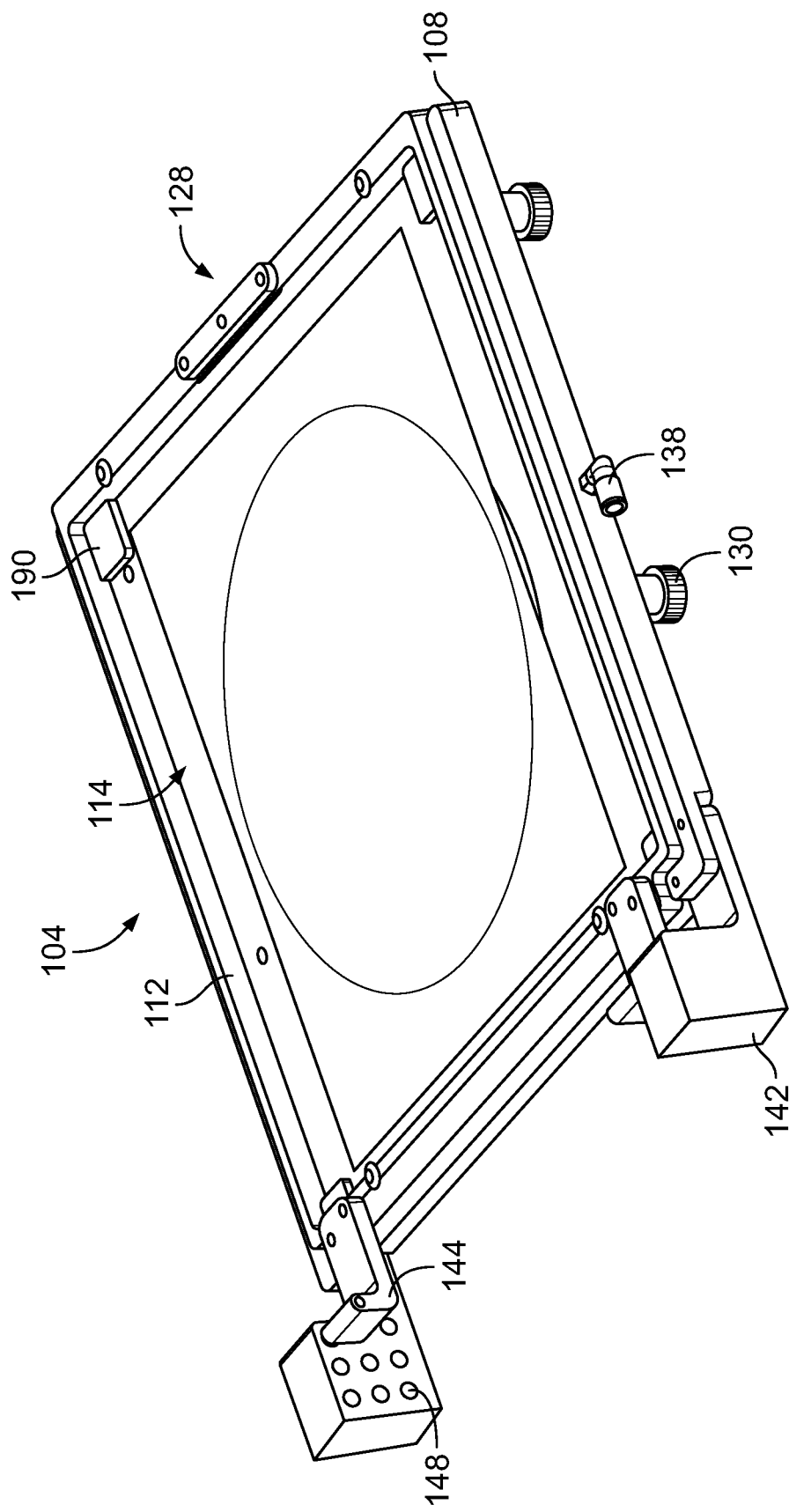
FIG. 5 is another implementation of the fixture that can be used with the system of FIG.

FIG. 5 is another implementation of the fixture 104 that can be used with the system 100 of FIG. 1. The fixture 104 of FIG. 5 is at least substantially similar to the fixture 104 of FIG. 4. However, in contrast, the base brackets 142 include a plurality of the coupling apertures 148 to allow the coupling point between the base 108 and the support 112 to change to different positions. While each of the base brackets 142 is shown including nine of the coupling apertures 148 in a particular arrangement, any number of coupling apertures may be included in any arrangement on either of the brackets 142, 144.

Figure 6:
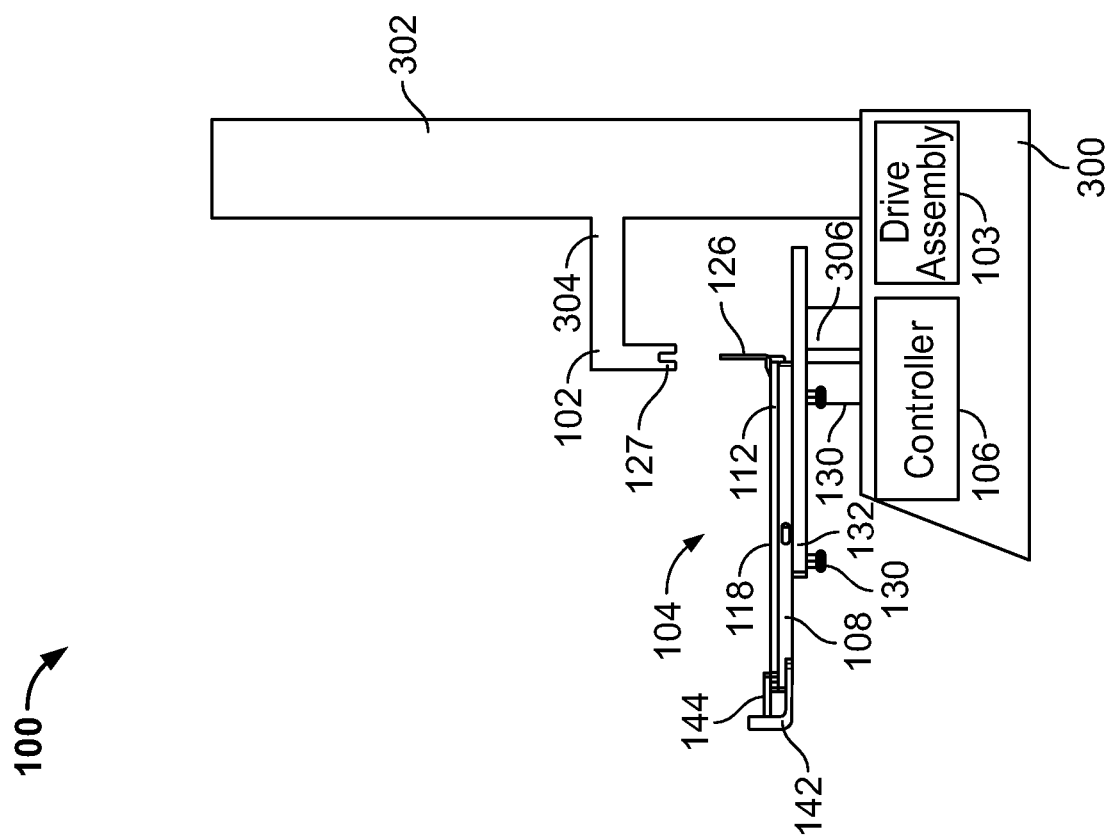
FIG. 6 illustrates a side view of an implementation of the system of FIG. 1.

FIG. 6 illustrates a side view of an implementation of the system 100 of FIG. 1. The system 100 includes a system base 300, a column 302, and a head 304 that is movably mounted to the column 302 and that carries the load cell 102. The system 100 also includes legs 306 that extend from the system base 300 and are coupled to the baseplate 132 and the fixture 104.

Figure 7:
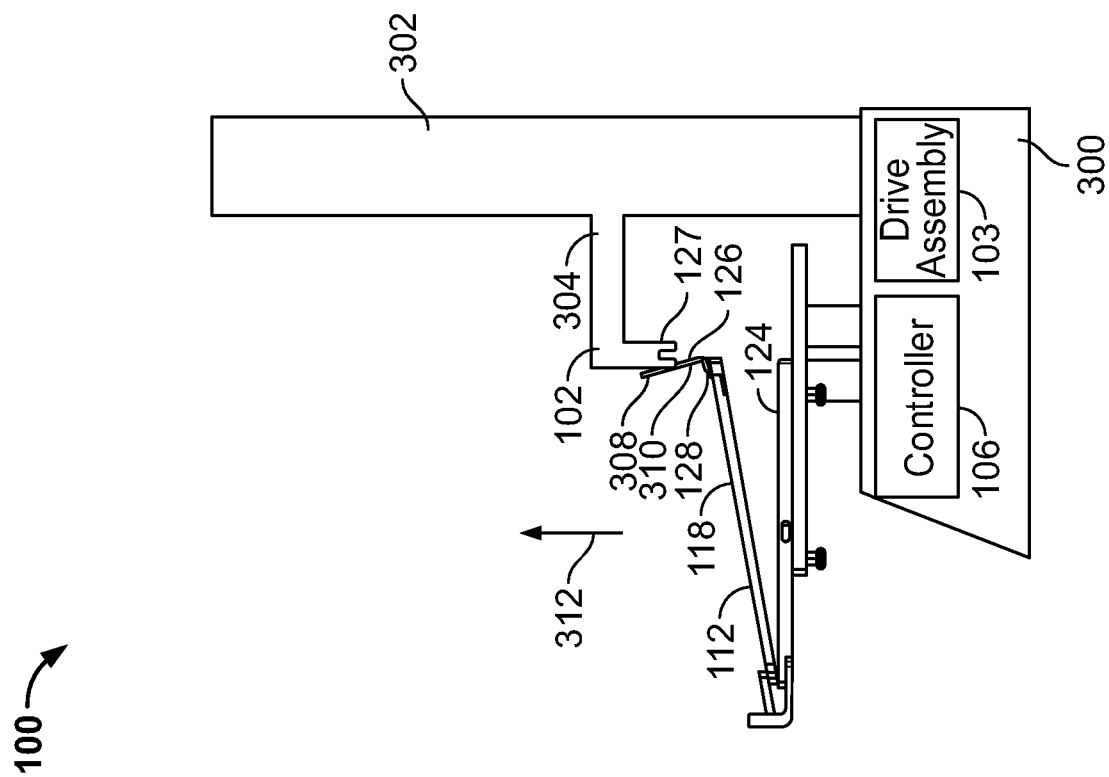
FIG. 7 illustrates a side view of the system of FIG. 6 detaching the mold from the cured resin.

FIG. 7 illustrates a side view of the system 100 of FIG. 6 detaching the mold 118 from the cured resin 124. In the implementation shown, a first end 308 of the coupling 126 is secured within the grippers 127 and a second end 310 of the coupling 126 is secured within the clamp 128 of the support 112. In operation, the head 304 of the system 100 moves the load cell 102 in a direction generally indicated by arrow 312 and the load cell 102 determines the force applied to the support 112 and the system 100 determines the resulting force versus a displacement profile of the resin 124 being measured.

Figure 8:
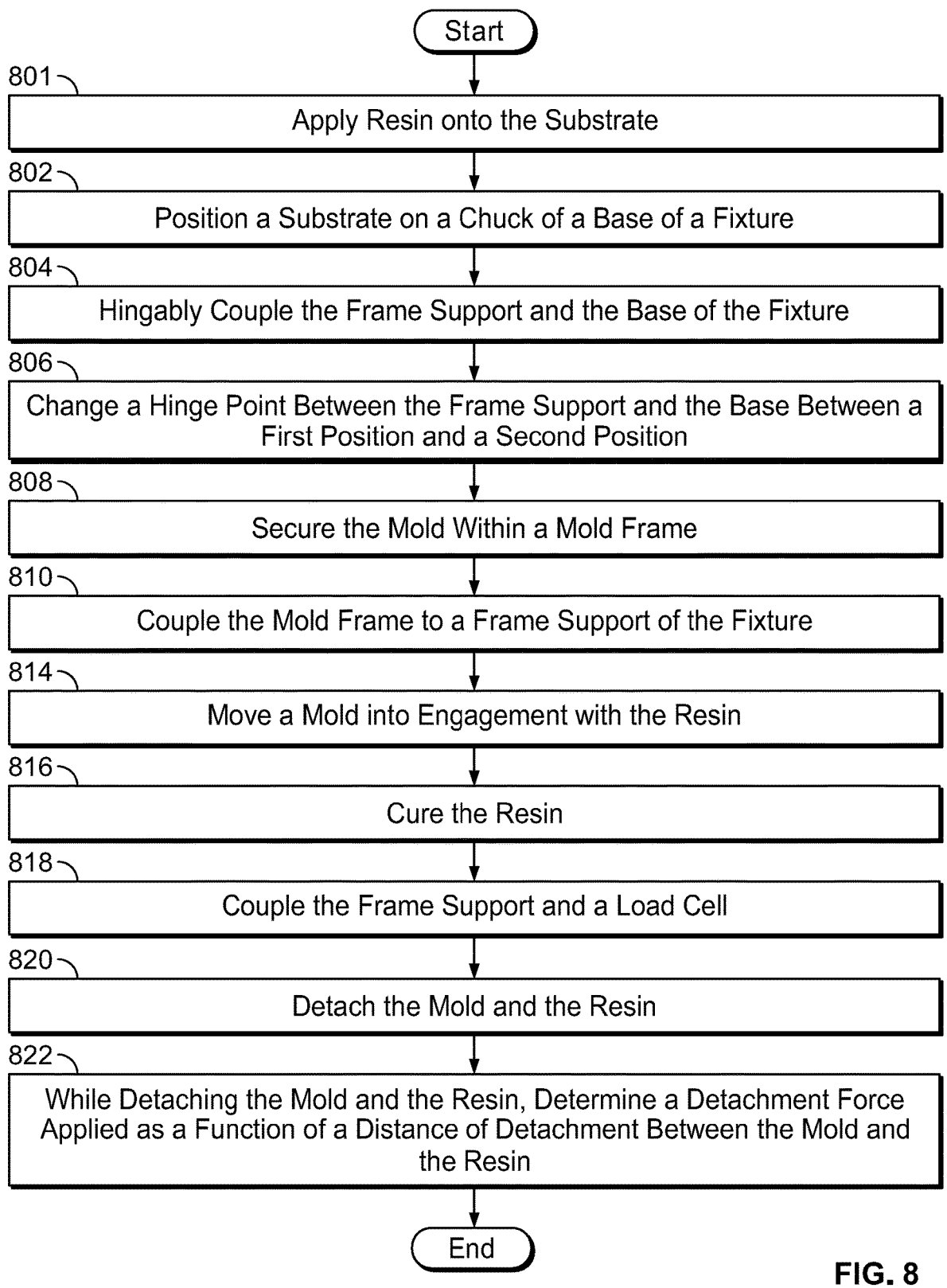
FIG. 8 illustrates a flowchart for an example method of determining detachment forces during a demolding procedure as disclosed herein.
Figure 9:
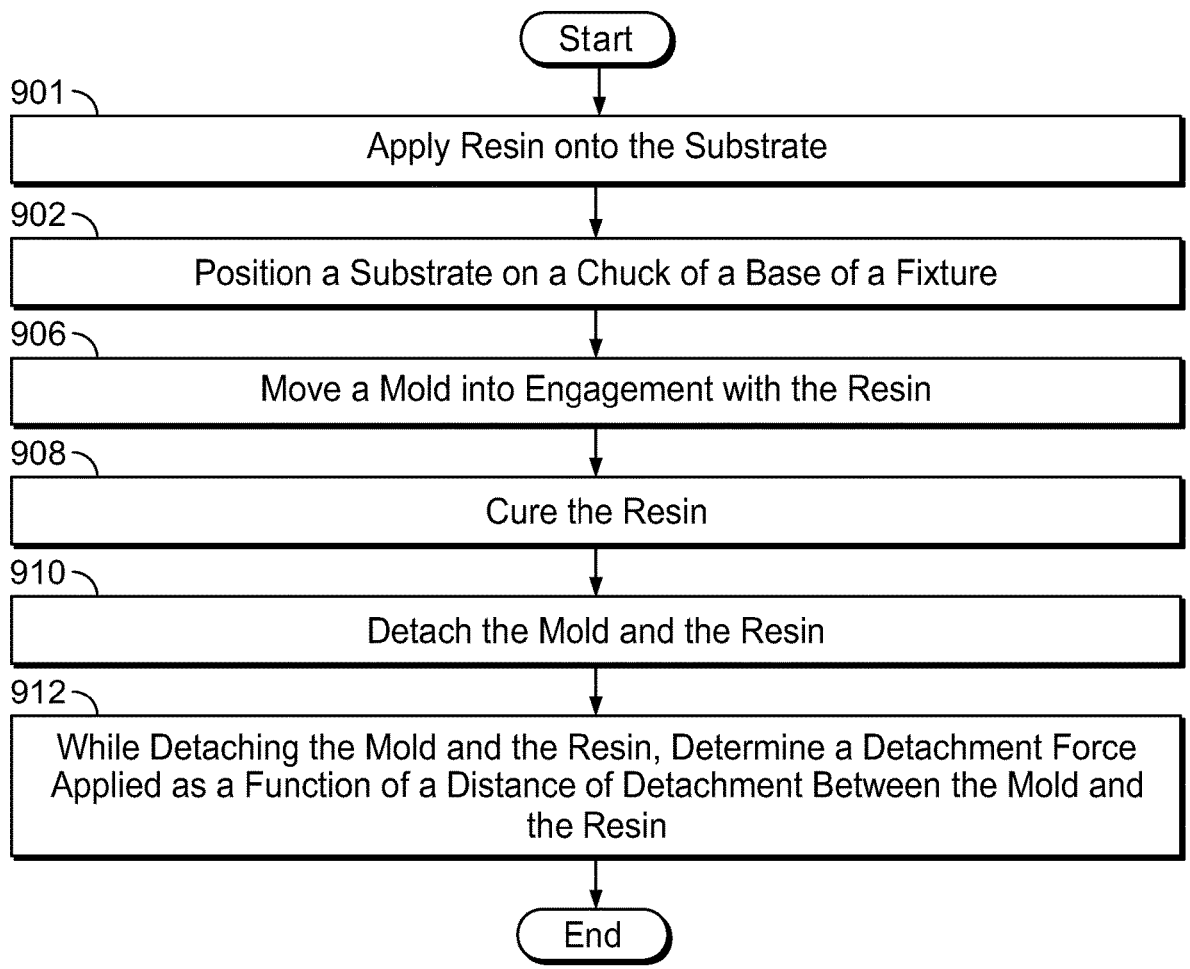
FIG. 9 illustrates another flowchart for an example method of determining detachment forces during a demolding procedure as disclosed herein.

FIGS. 8-10 illustrate flowcharts for example methods of determining detachment forces during a demolding procedure as disclosed herein. The order of execution of the blocks may be changed, and/or some of the blocks described may be changed, eliminated, combined, and/or subdivided into multiple blocks.

The process of FIG. 8 begins with the resin 124 being applied on to the substrate 122 (Block 801) via, for example, a spin coating technique. The substrate 122 is positioned on the chuck 110 of the base 108 of the fixture 104 (Block 802). The substrate 122 may be glass, silicon, and/or silicon dioxide. However, the substrate 122 may be made of different materials. The support 112 and the base 108 of the fixture 104 are hingably coupled (Block 804) and a hinge point between the support 112 and the base 108 is changed between a first position and a second positon (Block 806). Changing the position of the hinge point changes an amount of leverage that the support 112 provides when the support 112 is being urged upward during the demolding procedure. In some implementations, the hinge point is spaced from a plane defined by the mold 118 or the mold support 116 to allow the mold 118 to not inadvertently engage the resin 124 prior to the resin 124 being molded.

The mold 118 is secured within the mold support 116 (Block 808). In some implementations, securing the mold 118 within the mold support 116 includes coupling the mold 118 to the spring biased mold clamps 202 that keep the mold 118 in tension. The mold support 116 is coupled to the support 112 of the fixture 104 (Block 810) by, for example, nesting the mold support 116 within the support 112 to provide a secure coupling between the mold support 116 and the support 112.

To form a nanopattern array, the mold 118 is moved into engagement with the resin 124 (Block 814) to imprint the pattern 120 from the mold 118 into the resin 124. In some implementations, engaging the mold 118 and the resin 124 includes rotating the mold support 116 toward the base 108 of the fixture 104. The resin 124 is cured (Block 816) using, for example, UV nanoimprint lithography (NIL) curing techniques and/or thermal NIL curing techniques.

To perform a demolding procedure, the support 112 is coupled to the load cell 102 (Block 818). In some implementations, coupling the support 112 and the load cell 102 includes clamping the coupling 126, formed as a strap, within the clamp 128 at an end of the support 112 and coupling the strap to the load cell 102 includes positioning the coupling 126 within the associated grippers 127. The coupling 126 may also be a zip tie. However, other types of couplings may also be suitable.

The mold 118 and the cured resin 124 are detached from one another (Block 820). In some implementations, the drive assembly 103 detaches the mold 118 and the cured resin 124 by moving the load cell 102, attached to the support 112, away from the base 108 of the fixture 104. While the mold 118 and the resin 124 are being detached, a detachment force applied as a function of a distance of detachment between the mold 118 and the resin 124 is determined (Block 822). In some implementations, the load cell 102 determines a force applied to the support 112 and the system 100 determines the force applied as a function of a distance of detachment between the mold 118 and the resin 124.

The process of FIG. 9 begins with the resin 124 being applied to the substrate 122 (Block 901) via, for example, a spin coating technique, and the substrate 122 being positioned on the chuck 110 of the base 108 of the fixture 104 (Block 902). In some implementations, the resin 124 is applied to the substrate 122 before the substrate 122 is positioned on the chuck 110. To form a nanopattern array, the mold 118 is moved into engagement with the resin 124 (Block 906) to imprint the pattern 120 into the resin 124. The resin 124 is cured (Block 908) using, for example, UV nanoimprint lithography (NIL) curing techniques and/or thermal NIL curing techniques.

To perform a demolding procedure, the mold 118 and the cured resin 124 are detached from one another (Block 910). While the mold 118 and the resin 124 are being detached, a detachment force applied as a function of a distance of detachment between the mold 118 and the resin 124 is determined (Block 912). In some implementations, the load cell 102 determines a force applied to the support 112 and the system 100 determines the force applied as a function of a distance of detachment between the mold 118 and the resin 124. The system 100 can also be used to determine a detachment work value associated with the demolding procedure and the integrated curve of force versus detachment distance. The detachment force and/or the associated detachment work can be used to identify which resins produce nanoimprint arrays having higher quality and/or lower defect rates.

The process of FIG. 10 begins with the resin 124 being applied to the master template (Block 1002) via, for example, a spin coating technique. The resin 124 may fill into a pattern (similar to the pattern 120) defined by the master template.

The master template is positioned on the chuck 110 of the base 108 of the fixture 104 (Block 1002). In some implementations, the resin 124 is applied to the master template before the master template is positioned on the chuck 110. In such implementations, the vacuum pump 138 can be used to draw the master template toward the chuck 110 to deter the substrate 122 from moving while the resin 124 is applied to the master template. An anti-sticking layer may be applied to master template to reduce adhesion between the master template and the resin 124. The support 112 and the base 108 of the fixture 104 are hingably coupled (Block 1004) and a hinge point between the support 112 and the base 108 is changed between a first position and a second positon (Block 1006).

The unpatterned foil is secured within the mold support 116 (Block 1008). In some implementations, securing the unpatterned foil within the mold support 116 includes coupling the mold 118 to the spring biased mold clamps 202 to keep the unpatterned foil in tension. The mold support 116 is coupled to the support 112 of the fixture 104 (Block 1010) by, for example, nesting the mold support 116 within the support 112.

To form the mold 118, the unpatterned foil is moved into engagement with the resin 124 (Block 1014) to allow the resin 124 to adhere to the foil and/or to imprint the pattern 120 from the master template into the resin 124. In some implementations, engaging the unpattern foil and the resin 124 on the master template includes rotating the mold support 116 toward the base 108 of the fixture 104. The resin 124 is cured (Block 1016) using, for example, UV nanoimprint lithography (NIL) curing techniques and/or thermal NIL curing techniques.

To perform a demolding procedure, the support 112 is coupled to the load cell 102 (Block 1018). The master template and the cured resin 124 are detached from one another (Block 1020). When the cured resin 124 detaches from the master template, the cured resin 124 remains attached to the unpatterned foil (now patterned with the resin 124) to form the mold 118 for later use. While the master template and the resin 124 are being detached, a detachment force applied as a function of a distance of detachment between the mold 118 and the resin 124 is determined (Block 1022). The system 100 can also be used to determine a detachment work value associated with the demolding procedure and the integrated curve of force versus detachment distance. The detachment force and/or the associated detachment work can be used to identify which resin, mold-release coating, and/or foil produces molds 118 having higher quality and/or lower defect rates.

Figure 11:
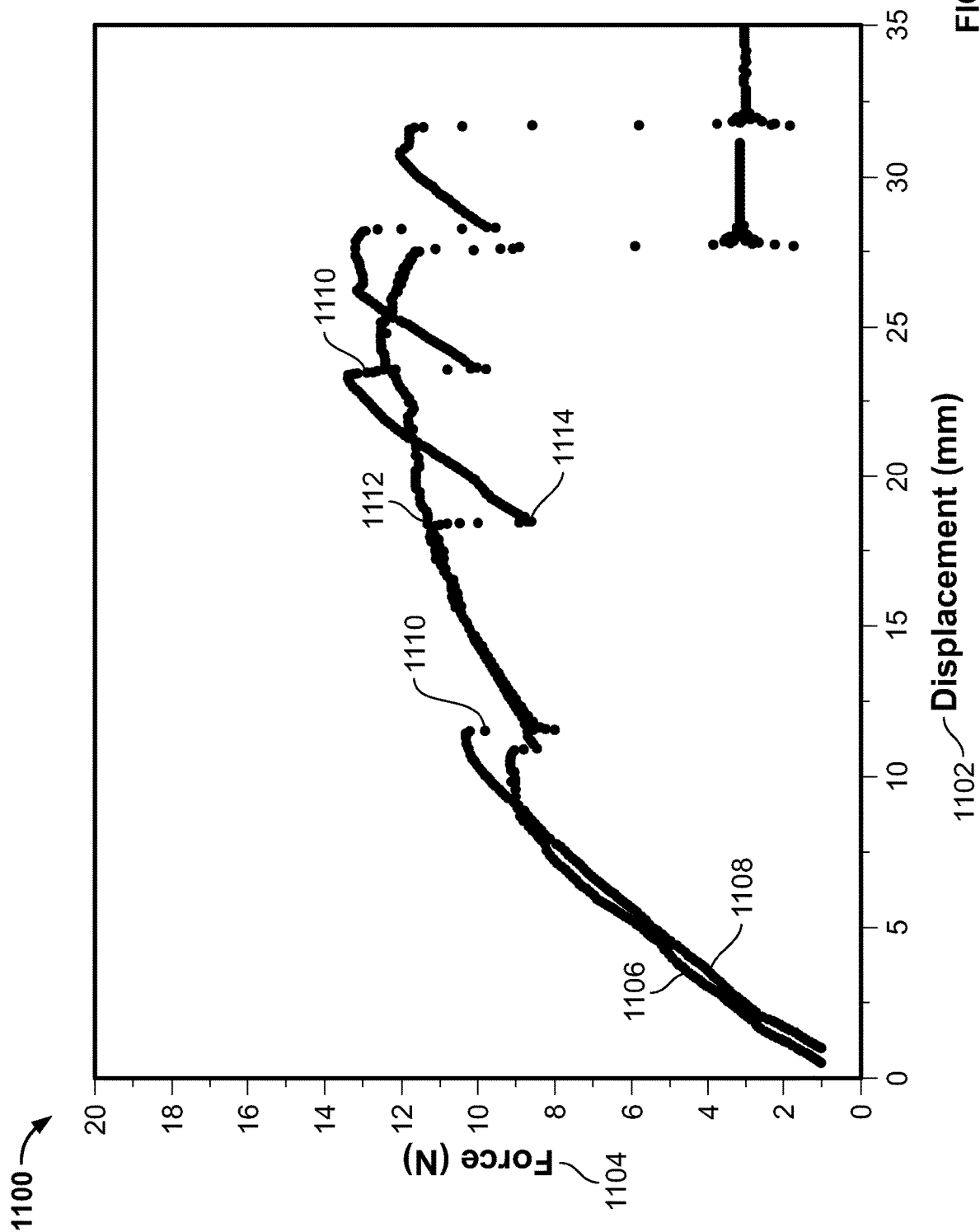
FIG. 11 is a graph showing test results using the example systems disclosed herein.

FIG. 11 is a graph 1100 showing test results using the example systems 100 disclosed herein. In the tests performed, a demolding procedure was monitored to determine force versus displacement for two different resins when producing nanopattern arrays having different pattern densities. The graph 1100 includes an X-axis 1102 representing displacement of the load cell 102 and/or the support 112 in millimeters (mm) and a Y-axis 1104 representing the force applied to the support 112 in Newtons (N). During the tests performed, the load cell 102 was moved at a rate of approximately 50 mm/minute (min). However, the load cell 102 may be moved at a different rate such as, for example, 10 mm/min and/or 100 min/min.

In the graph shown, a first curve 1106 represents the results using a first resin and a second curve 1108 represents the results using a second resin. The curves 1106, 1108 include drop areas 1110 having a saw tooth profile where the force applied by the system 100 decreases sharply. The saw tooth profile is sometimes referred to as "stick-slip" and may be the result of a patterned portion of the nanopattern array transitioning to an unpatterned portion of the nanopattern array. The large changes in force at these drop areas 1110 may cause the nanopattern arrays to have defects. As shown, the drop areas 1110 of the second curve 1108 have a larger magnitude, represented by the difference in reference numbers 1112, 1114, and thus, the nanopattern arrays produced using the second resin may have more defects. An operator can use the feedback provided by the graph 1100 to select the first resin having the lower detachment forces over the second rein having the higher detachment forces for larger scale production. Some parameters that affect the detachment forces include resin composition and the pattern of the nanopattern array.

Figure 12:
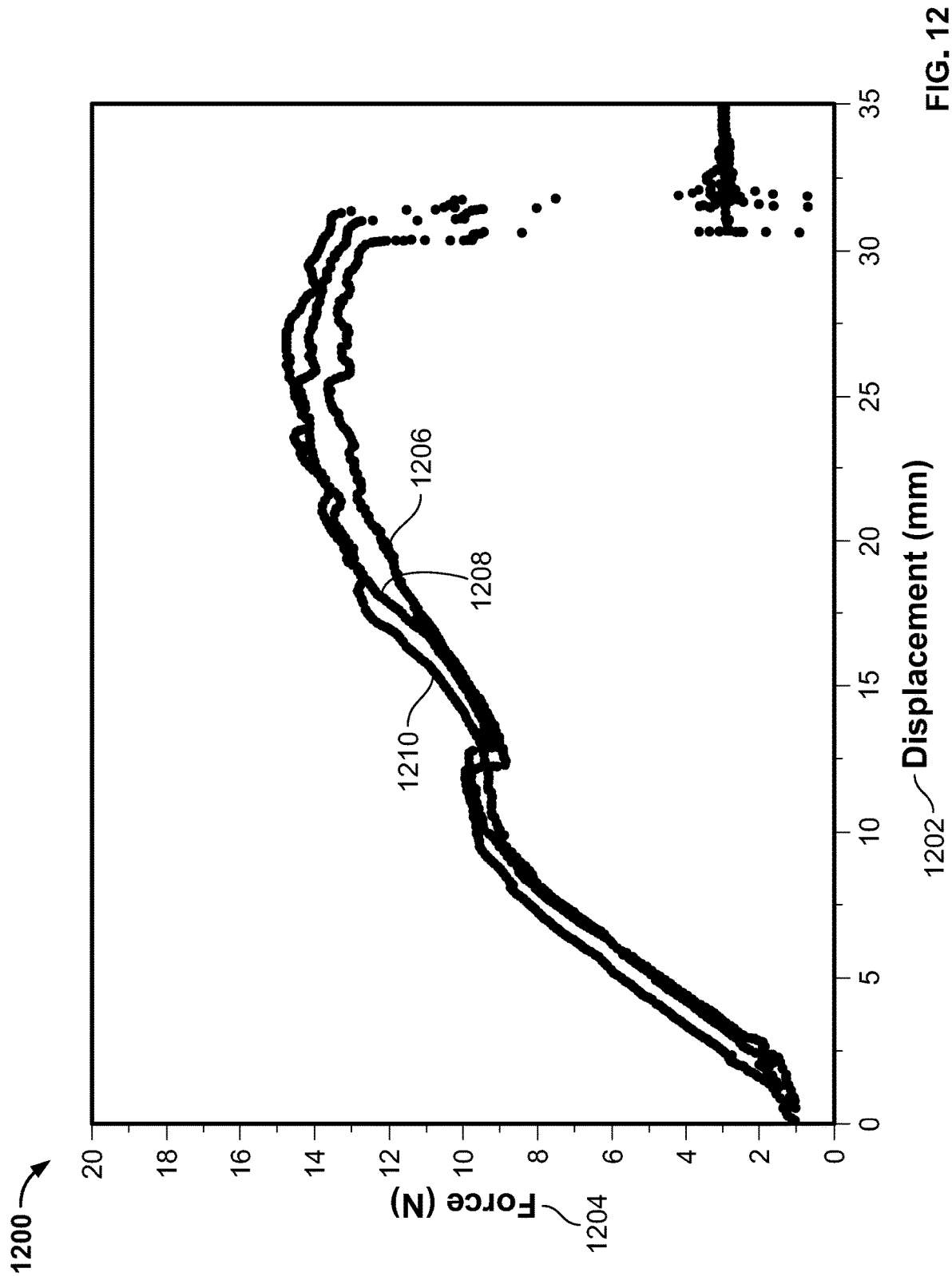
FIG. 12 is a graph showing test results using the example systems disclosed herein.

FIG. 12 is a graph 1200 showing test results using the example systems 100 disclosed herein. In the tests performed, a demolding procedure was monitored using different detachment rates to determine force versus displacement. The graph 1200 includes an X-axis 1202 representing displacement of the load cell 102 and/or the support 112 in millimeters (mm) and a Y-axis 1204 representing the force applied to the support 112 in Newtons (N).

In the graph shown, a first curve 1206 represents the results using a 10 mm/min detachment rate, a second curve 1208 represents the results using a 50 min/mm detachment rate, and a third curve 1210 represents the results using a 100 min/mm detachment rate. As shown, the higher detachment rates represented by the second curve 1208 and the third curve 1210 have a higher detachment forces and, thus, may lead to more defects being present in the nanopattern arrays produced. More specifically, the detachment force for the second curve 1208 and the third curve 1210 are about 1 N higher than the detachment force of the first curve 1206 between or equal to about 17 mm and about 30 mm of displacement. Based on the feedback provided by the graph 1200 and to reduce the detachment forces, an operator can use a first detachment rate (e.g., 100 mm/min) for a first portion of the demolding process (e.g., up to and equal to about 15 mm of displacement) and use a second detachment rate (e.g., 10 mm/min) for a second portion of the demolding process (e.g., equal to or greater than 15 mm of displacement). More generally, the feedback provided by the graph 1200 allows an operator to create a custom detachment rate profile that results in less product defects.

The foregoing description is provided to enable a person skilled in the art to practice the various configurations described herein. While the subject technology has been particularly described with reference to the various figures and configurations, it should be understood that these are for illustration purposes only and should not be taken as limiting the scope of the subject technology.

As used herein, an element or process recited in the singular and proceeded with the word "a" or "an" should be understood as not excluding plural of said elements or processes, unless such exclusion is explicitly stated. Furthermore, references to "one implementation" are not intended to be interpreted as excluding the existence of additional implementations that also incorporate the recited features. Moreover, unless explicitly stated to the contrary, implementations "comprising," "including," or "having" an element or a plurality of elements having a particular property may include additional elements whether or not they have that property. Moreover, the terms "comprising," including," having," or the like are interchangeably used herein.

The terms "substantially," "approximately," and "about" used throughout this Specification are used to describe and account for small fluctuations, such as due to variations in processing. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

There may be many other ways to implement the subject technology. Various functions and elements described herein may be partitioned differently from those shown without departing from the scope of the subject technology. Various modifications to these implementations may be readily apparent to those skilled in the art, and generic principles defined herein may be applied to other implementations. Thus, many changes and modifications may be made to the subject technology, by one having ordinary skill in the art, without departing from the scope of the subject technology. For instance, different numbers of a given module or unit may be employed, a different type or types of a given module or unit may be employed, a given module or unit may be added, or a given module or unit may be omitted.

Underlined and/or italicized headings and subheadings are used for convenience only, do not limit the subject technology, and are not referred to in connection with the interpretation of the description of the subject technology. All structural and functional equivalents to the elements of the various implementations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

It should be appreciated that all combinations of the foregoing concepts and additional concepts discussed in greater detail below (provided such concepts are not mutually inconsistent) are contemplated as being part of the subject matter disclosed herein. In particular, all combinations of claimed subject matter appearing at the end of this disclosure are contemplated as being part of the subject matter disclosed herein.

What is claimed is:

1. A method, comprising:
applying a resin onto a substrate;
positioning the substrate over a chuck of a base of a fixture;
moving a mold into engagement with the resin, the mold configured to be secured within a mold support;
curing the resin;
detaching the mold and the resin; and
while detaching the mold and the resin, determining a detachment force applied as a function of a distance of detachment between the mold and the resin, wherein a hinge and a hinge point between the base and the mold are spaced from a plane defined by the mold or the mold support.

2. The method of claim 1, further comprising securing the mold within the mold support and coupling the mold support to a fixture support.

3. The method of claim 2, further comprising hingably coupling the fixture support and the base of the fixture.

4. The method of claim 2, further comprising changing the hinge point between the fixture support and the base between a first position and a second position.

5. The method of claim 4, wherein changing the hinge point includes spacing the hinge point from the plane defined by the mold or the mold support.

6. The method of claim 2, further comprising coupling the fixture support and a load cell and wherein detaching the mold and the resin includes detaching the mold and the resin while the fixture support is coupled to the load cell.

7. The method of claim 6, wherein coupling the fixture support and the load cell comprises clamping a strap at an end of the fixture support and coupling the strap to the load cell.

8. The method of claim 7, wherein clamping the strap comprises closing a clamp at an end of the fixture support.

9. The method of claim 2, wherein engaging the mold and the resin comprises rotating the mold support toward the base of the support fixture.

10. The method of claim 1, further comprising drawing the substrate toward the chuck using a vacuum.

11. A method, comprising:
applying a resin onto a substrate;
positioning the substrate over a chuck of a base of a fixture;
moving a mold into engagement with the resin;
securing the mold within a mold support and coupling the mold support to a fixture support;
curing the resin;
detaching the mold and the resin;
while detaching the mold and the resin, determining a detachment force applied as a function of a distance of detachment between the mold and the resin; and
changing a hinge and a hinge point between the fixture support and the base between a first position and a second position, wherein changing the hinge point includes spacing the hinge point from a plane defined by the mold or the mold support.

12. A method, comprising:
applying a resin onto a substrate;
positioning the substrate over a chuck of a base of a fixture;
moving a mold into engagement with the resin;
securing the mold within a mold support and coupling the mold support to a fixture support;
curing the resin;
detaching the mold and the resin;
while detaching the mold and the resin, determining a detachment force applied as a function of a distance of detachment between the mold and the resin, wherein a hinge and a hinge point between the base and the mold are spaced from a plane defined by the mold or the mold support; and
coupling the support and a load cell and wherein detaching the mold and the resin includes detaching the mold and the resin while the fixture support is coupled to the load cell, wherein coupling the support and the load cell comprises clamping a strap at an end of the fixture support and coupling the strap to the load cell and clamping the strap comprises closing a clamp at an end of the support, wherein the strap comprises a zip tie.

* * * * *